United States Patent
Hiramoto et al.

(10) Patent No.: US 9,552,984 B2
(45) Date of Patent: Jan. 24, 2017

(54) PROCESSING METHOD OF SUBSTRATE AND MANUFACTURING METHOD OF LIQUID EJECTION HEAD

(71) Applicant: CANON KABUSHIKI KAISHA, Tokyo (JP)

(72) Inventors: Atsushi Hiramoto, Machida (JP); Atsunori Terasaki, Kawasaki (JP); Ryoji Kanri, Zushi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/963,493

(22) Filed: Dec. 9, 2015

(65) Prior Publication Data

US 2016/0176193 A1 Jun. 23, 2016

(30) Foreign Application Priority Data

Dec. 18, 2014 (JP) ................. 2014-256176

(51) Int. Cl.
 *H01L 23/12* (2006.01)
 *H01L 21/02* (2006.01)
 *B41J 2/14* (2006.01)
 *B41J 2/16* (2006.01)

(52) U.S. Cl.
 CPC ........ *H01L 21/0234* (2013.01); *B41J 2/14016* (2013.01); *B41J 2/14145* (2013.01); *B41J 2/1603* (2013.01); *B41J 2/1628* (2013.01); *B41J 2/1631* (2013.01); *H01L 21/0212* (2013.01)

(58) Field of Classification Search
 CPC ........................................... B41J 2/1626
 USPC ................................... 438/700–714
 See application file for complete search history.

(56) References Cited

U.S. PATENT DOCUMENTS

| | | | |
|---|---|---|---|
| 6,277,756 B1 | 8/2001 | Ohara et al. | |
| 2012/0028383 A1* | 2/2012 | Hiramoto | B41J 2/1603 438/21 |
| 2013/0052826 A1* | 2/2013 | Nepomnishy | G21K 1/025 438/694 |
| 2013/0052829 A1* | 2/2013 | Leverd | H01L 21/76224 438/696 |
| 2013/0344699 A1* | 12/2013 | Chiba | H01L 21/02118 438/700 |

FOREIGN PATENT DOCUMENTS

JP 2000-299310 A 10/2000

* cited by examiner

*Primary Examiner* — Dung Le
(74) *Attorney, Agent, or Firm* — Fitzpatrick, Cella, Harper & Scinto

(57) ABSTRACT

There are provided a processing method of a substrate in which in forming a trench on the substrate by etching, a side wall surrounding the trench is surely protected, and a manufacturing method of a liquid ejection head. The methods include: repeating sequentially a plurality of cycles of a trench forming step of forming the trench on a printing element substrate, a first protection layer forming step of forming a passivation layer, and a first protection layer removing step of removing a portion at which the trench is excavated in the passivation layer. A second protection layer forming step and a second protection layer removing step are performed between the trench forming step through the first protection layer removing step repeated in a plurality of cycles and the trench forming step through the first protection layer removing step repeated next.

12 Claims, 8 Drawing Sheets

PROCESSING METHOD OF SUBSTRATE AND MANUFACTURING METHOD OF LIQUID EJECTION HEAD

BACKGROUND OF THE INVENTION

Field of the Invention

The present invention relates to a processing method of substrate in which in forming a trench on the substrate by etching, a side wall surrounding the trench can be precisely formed, and a manufacturing method of liquid ejection head.

Description of the Related Art

In performing processing of forming a trench, such as a deep hole or groove, on a silicon substrate made of silicon, the Bosch process is occasionally employed as a method for the processing. In the Bosch process, steps of etching a substrate, forming a passivation layer, which protects the substrate, on a portion where the etching was performed, and removing the passivation layer on a portion to be excavated are sequentially repeated. In performing the processing, in a state in which the passivation layer is formed in a lateral direction on a side wall surrounding the trench, the trench is excavated. Since the trench is excavated in a state in which the side wall is protected by the passivation layer, in performing etching, local expansion of the trench in a direction crossing a depth direction is suppressed to allow the trench to be appropriately excavated in the depth direction.

However, in a case of performing etching for forming a deep trench having a high aspect ratio, the number of times of repeating the above steps increases. In this case, for further excavation of the trench, the step of removing the passivation layer on a bottom portion of the trench is also repeated. In the step of removing the passivation layer on the bottom portion of the trench, irradiation of an $SF_6$ (sulfur hexafluoride) gas, for example, to the bottom portion of the trench is performed. The bottom portion of the trench is exposed to the gas such as $SF_6$, and whereby the passivation layer covering a position at which the trench is excavated is removed.

In a case of removing the passivation layer by using the gas such as $SF_6$, ion tracks are not always ideally perpendicular to the substrate. Since ions present in plasma have speeds in all directions, in irradiating the substrate with the ions, the ions have a speed also in a component in a horizontal direction crossing the depth direction of the trench. The ions have the speed remaining in the horizontal direction, and thus ions colliding with the side wall surrounding the trench exist. Accordingly, the ions collide with the side wall to scrape off the side wall, and as a result, the side wall may possibly be deformed.

In a shallow portion of the trench, each time the step of removing the passivation layer is repeated, collision between the side wall of the trench and the ions moving in the horizontal direction occurs. Therefore, in the shallow portion of the trench, as the number of times of performing the step of removing the passivation layer increases, the number of times of collision between the side wall and the ions increases.

Japanese Patent Laid-Open No. 2000-299310 discloses a method in which, for the purpose of reducing deformation of a side wall, an oxide film ($SiO_2$) obtained by oxidizing a silicon substrate is formed on the side wall of a trench. Since the oxide film of silicon is highly resistant to damage at the time of collision with ions, forming the trench in a state in which the oxide film is formed on the side wall, by means of the Bosch process, can suppress deformation of the side wall. In Japanese Patent Laid-Open No. 2000-299310, by generating oxygen plasma in a chamber in which the substrate is disposed to oxidize the silicon substrate, the oxide film is formed on the side wall of the trench.

SUMMARY OF THE INVENTION

In a first aspect of the present invention, there is provided processing method of a substrate comprising the steps of repeating sequentially a plurality of cycles, each cycle including: a trench forming step of forming a trench on the substrate by etching; a first protection layer forming step of forming, inside the trench, a first protection layer; and a first protection layer removing step of removing a portion of the first protection layer covering a position at which the trench is further excavated; and performing a second protection layer forming step and a second protection layer removing step between a first cycle in which one cycle from the trench forming step through the first protection layer removing step is repeated a plurality of times and a second cycle which is performed subsequently to the first cycle and in which one cycle from the trench forming step through the first protection layer removing step is repeated a plurality of times, in the second protection layer forming step, a second protection layer being formed inside the trench formed in the first cycle, according to the number of cycles in the second cycle, and in the second protection layer removing step, a portion of the second protection layer covering a position at which the trench is further excavated being removed.

In a second aspect of the present invention, there is provided a manufacturing method of liquid ejection head including an ejection port forming member configured to form an ejection port, a substrate which is attached to the ejection port forming member, a liquid chamber being formed between the ejection port forming member and the substrate, and an element being disposed on a position facing the liquid chamber, the manufacturing method of the liquid ejection head comprising: repeating sequentially a plurality of cycles of: a trench forming step of forming a trench on the substrate by etching; a first protection layer forming step of forming, inside the trench, a first protection layer; and a first protection layer removing step of removing a portion of the first protection layer covering a position at which the trench is further excavated; and performing a second protection layer forming step and a second protection layer removing step between a first cycle in which one cycle from the trench forming step through the first protection layer removing step is repeated a plurality of times and a second cycle which is performed subsequently to the first cycle and in which one cycle from the trench forming step through the first protection layer removing step is repeated a plurality of times, in the second protection layer forming step, a second protection layer according to the number of cycles in the second cycle being formed inside the trench formed in the first cycle, and in the second protection layer removing step, a portion of the second protection layer covering a position at which the trench is further excavated being removed Further features of the present invention will become apparent from the following description of exemplary embodiments (with reference to the attached drawings).

DESCRIPTION OF THE EMBODIMENTS

However, in the method in which the oxide film is formed on the side wall by oxidizing the silicon substrate to protect the side wall, the thickness of the oxide film to be formed is limited. Once the oxide film is formed having a certain thickness, it becomes difficult to increase the thickness from the thickness. Accordingly, depending on the frequency of etching and removal of the passivation layer which are subsequently performed, the thickness of the oxide film may become possibly insufficient. Therefore, even if the passivation layer is formed on the side wall on which the oxide film is formed, the side wall may possibly be deformed due to the insufficient thickness of the passivation layer and oxide film.

Here, considering the above circumstances, an object of the present invention is to provide a processing method of substrate by which protection of a side wall surrounding a trench in forming the trench on a substrate by etching is ensured and a manufacturing method of liquid ejection head.
(First Embodiment)

A print head as a liquid ejection head according to a first embodiment of the present invention will be described with reference to the drawings.

A method for manufacturing the print head according to the present embodiment will be described. In the method for manufacturing the print head according to the present embodiment, an ink supply port 33 extending in a thickness direction of a printing element substrate 1 is formed by etching. A method for forming the ink supply port extending in the thickness direction of the printing element substrate 1 will be described.

In the present embodiment, a trench extending in the thickness direction of the printing element substrate 1 and having a relatively high aspect ratio is formed so as to form the ink supply port. Once the trench is formed on the printing element substrate 1 to communicate with a liquid chamber through the printing element substrate 1, the trench becomes functional as the ink supply port for supplying ink to the liquid chamber. For forming this trench, the so-called Bosch process is employed. Each of the steps in forming the trench on the printing element substrate 1 by employing the Bosch process will be described with reference to FIGS. 1A to 1F.

It should be noted that the ink supply port is formed extending along a direction in which an array of ejection ports is arranged on the printing element substrate 1. Accordingly, the trench is required to be ultimately formed extending along the direction in which the array of ejection ports is arranged. Therefore, the trench may be gradually excavated along the direction in which the array of election ports is arranged while the trench is excavated in the thickness direction of the printing element substrate.

In the Bosch process, three steps of etching the printing element substrate 1, forming the passivation layer on a portion where the etching was performed, and removing the passivation layer on a portion to be excavated are sequentially repeated in a plurality of cycles.

Figure 1A:
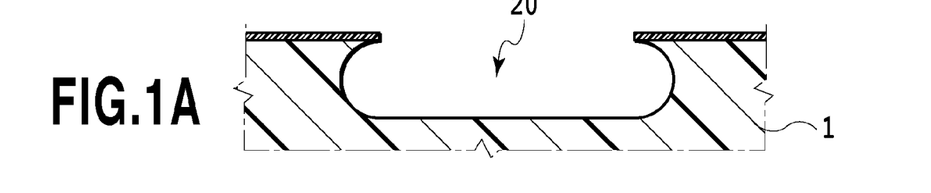
FIGS. 1A to 1F are cross-sectional views showing a process of excavating a trench by repeating first through third steps in forming the trench on a printing element substrate.

In the Bosch process, in the step of etching the printing element substrate 1, by irradiating the substrate with an F (fluorine)-based radical, the etching is performed (a first step; a step of forming a trench). The irradiation of the F-based radical is directed to a front face of the printing element substrate 1 and is in a direction orthogonal to the front face of the printing element substrate 1. Consequently, by the F-based radical, the printing element substrate 1 is scraped off in the direction orthogonal to the front face of the printing element substrate 1, thereby forming a trench 20 extending in a thickness direction of the printing element substrate 1 (FIG. 1A). At this time, the trench is formed by isotropic etching.

Figure 1B:
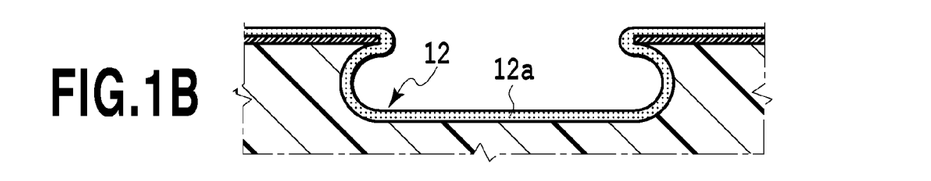

Once the etching is performed, a step of forming a passivation layer (a first protection layer) 12 on a portion inside the trench 20 on which the etching was performed, is performed (a second step; a step of forming the first protection layer). In the step of forming the passivation layer 12, by irradiating the portion, on which the etching was performed, of the substrate with a CF-based gas, such as $CF_4$ and $C_4F_8$, a CF-based passivation layer 12 is formed on a surface inside the trench formed on the substrate. In the present embodiment, $C_4F_8$ is used for forming the passivation layer 12. Here, over the entire front face of the printing element substrate 1 including the inside of the trench 20, the passivation layer 12 is formed (FIG. 1B).

Figure 1C:
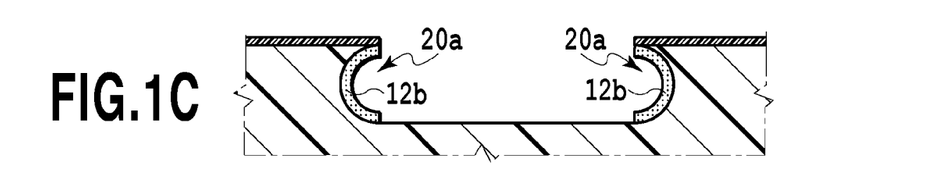

Once the step of forming the passivation layer 12 on the portion on which the etching was performed is performed, a step of removing a passivation layer 12a at a position covering a bottom portion which is a portion of the trench 20 to be excavated is performed (a third step; a step of removing the first protection layer). In the step of removing the passivation layer 12a on the bottom portion of the trench 20, the bottom portion of the trench 20 is irradiated with an $SF_6$ (sulfur hexafluoride) gas. By exposing the bottom portion of the trench 20 to the $SF_6$ gas, the passivation layer 12a at the position covering the bottom portion which is the portion of the trench 20 to be excavated is removed (FIG. 1C). Here, by performing anisotropic etching, the passivation layer 12a on the bottom portion of the trench is removed without removing a passivation layer 12b formed on a side wall.

After forming the passivation layer 12 over the entire front face of the printing element substrate 1 including an inside of the trench 20, the passivation layer 12a on the bottom portion is removed and the passivation layer 12b remains on a side wall 20a of the trench 20. Since the passivation layer 12b remains on the side wall 20a, in the subsequent steps of etching and removing the passivation layer 12, unintentional scraping of the side wall 20a of the trench 20 can be suppressed. Unintentional scraping of the side wall 20a of the trench 20 is suppressed, and deformation of the trench 20 is suppressed accordingly.

Figure 1D:
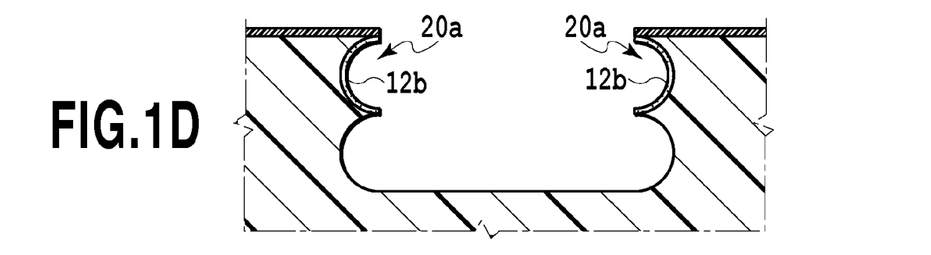

Once the passivation layer 12a on the bottom portion of the trench 20 is removed, the trench is further excavated by etching after the removal (FIG. 1D). At this time, by performing the isotropic etching similarly to the step shown in FIG. 1A, the etching is performed for next excavation of the trench. Here, since by the isotropic etching, the etching of a portion of the trench to be further excavated is performed, the etching of the passivation layer 12b which is already formed on the side wall of the trench is also performed. Accordingly, the passivation layer 12b already formed on the side wall of the trench is scrapped off to become thinner.

Figure 1E:
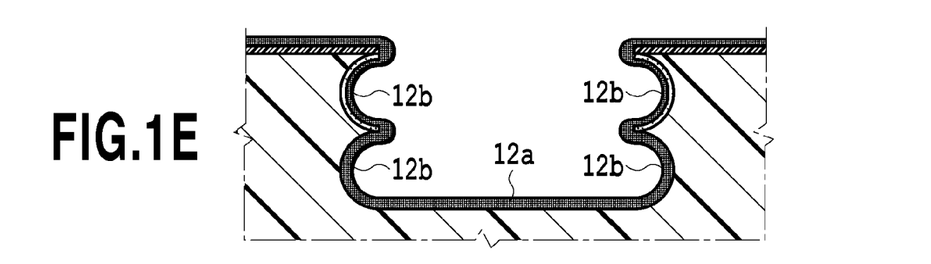

Once a newly excavated trench is formed, the passivation layer 12 is formed thereon similarly to the step shown in FIG. 1B. By irradiating the inside portion of the trench with the $C_4F_8$ gas, the passivation layer 12 of the $C_4F_8$ is formed on a surface of the inside portion of the trench (FIG. 1E). In the trench on which the passivation layer 12b is already formed, a new passivation layer 12b is formed overlapping the passivation layer 12b already formed. At a stage in which the passivation layer 12 is formed on the trench newly formed, due to the etching for forming the new trench, the passivation layer 12b which is already formed becomes thinner. Therefore, even if the new passivation layer 12b is formed overlapping the passivation layer 12b already formed, the thickness of the passivation layer 12b is not substantially different from that of the passivation layer 12b newly formed. Accordingly, the thickness of the layer in which the new passivation layer 12b overlaps the already formed passivation layer 12b on the trench 20 is not substantially different from that of the passivation layer 12b newly formed on the trench 20. The relation in terms of thickness does not change as the excavation of the trench proceeds. Therefore, in the process of forming the trench, the thickness of the passivation layer 12b, from a shallow portion to a deep portion of the trench, is not substantially changed.

Figure 1F:
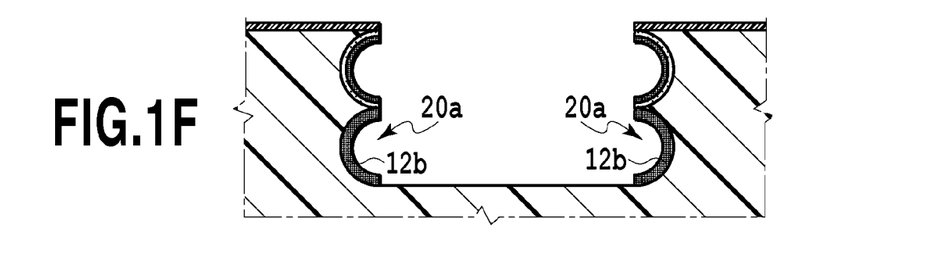

As shown in FIG. 1E, once the passivation layer 12 is formed on the trench newly formed, the passivation layer 12a formed at a position covering the bottom portion of the trench 20 is removed again (FIG. 1F).

Subsequently, the steps in FIGS. 1C to 1F are repeated in a plurality of cycles. In this manner, by repeating the steps of excavating the trench 20 by etching, forming the passivation layer 12, and removing the passivation layer 12a on the bottom portion of the trench 20, a deep trench can be formed on the printing element substrate 1.

In the present embodiment, the first through third steps are repeated in n cycles (n is two or more) (a first cycle), and subsequently, the first through third steps are further repeated in n cycles (a second cycle). In the present embodiment, between the first cycle in which the first through third steps are repeated in n cycles and the second cycle in which the first through third steps are repeated in n cycles, a step of providing a passivation layer (a second protection layer) for the side wall is added. In the first cycle, one cycle from the first through third steps is repeated a plurality of times and also in the second cycle, one cycle from the first through third steps is repeated a plurality of times. In the present embodiment, n cycles of the first cycle and n cycles of the second cycle are performed. Further, between the first cycle and the second cycle performed subsequently to the first cycle, the step of providing the passivation layer for protecting the side wall is performed. It should be noted that in the present invention, the number of cycles n of repeating the first through third steps is an integer of two or more.

A method for processing the printing element substrate 1 according to the present embodiment in which between n cycles of the first through third steps repeated and n cycles of the first through third steps repeated, the step of providing the passivation layer on the side wall is added will be described, with reference to FIGS. 2A to 2D.

Figure 2A:
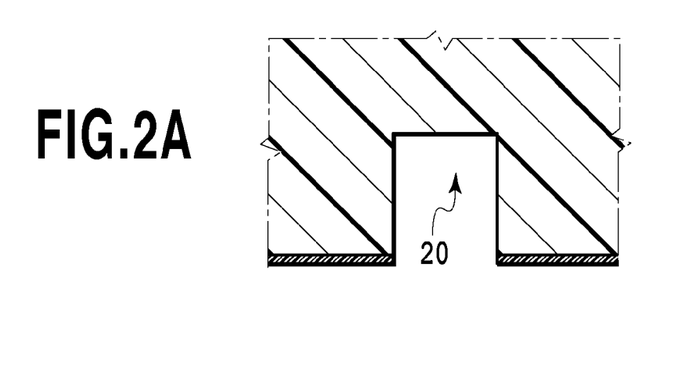
FIGS. 2A to 2D are cross-sectional views, each showing each of steps in forming, between the first through third steps repeated and the first through third steps repeated, a passivation layer on a side wall surrounding the trench in preparation for the first through third steps repeated next.

By repeating the first through third steps in n cycles, the trench 20 is formed (FIG. 2A).

Figure 2B:
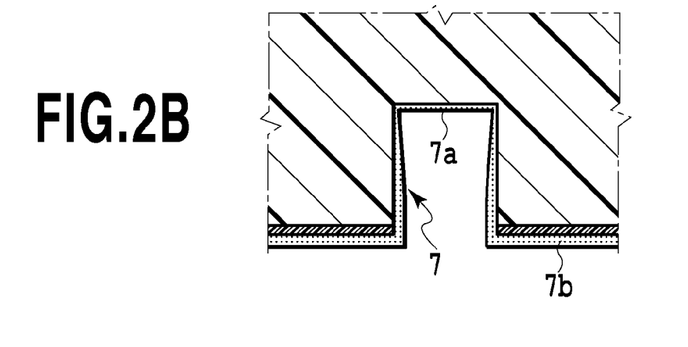

After repeating the first through third steps in n cycles, prior to the first through third steps next repeated in n cycles, a step of forming a passivation layer 7, which is the second protection layer, is performed (a fourth step) (FIG. 2B). In the present embodiment, also in the fourth step, by supplying the CF-based gas to the inside of the trench, the passivation layer 7 is formed inside the trench. In the present embodiment, by supplying the $C_4F_8$ to the inside of the trench, the passivation layer 7 is formed.

The thickness of the passivation layer 7 which is formed in the fourth step between n cycles of the first through third steps repeated and n cycles of the first through third steps repeated is almost the same as the thickness of the passivation layer 12 formed in the first through third steps repeated in n cycles. The thickness of the passivation layer mentioned here refers to a supply amount of a material (the $C_4F_8$ in the present embodiment) constituting the passivation layer 7 in forming the passivation layer 7. That is, the thickness of the passivation layer 7 mentioned here is not the thickness of the passivation layer 7 finally remaining after the completion of the formation of the trench 20. This is because after the completion of the formation of the trench 20, the actual thickness of the passivation layer formed on the side wall is reduced due to collision with ions and F radical reaction, as compared to the thickness immediately after the formation. The thickness of the passivation layer 7 refers to the thickness of the passivation layer 7 immediately after the formation of the passivation layer 7, at which the collision with ions or the F radical reaction does not yet occur. Further, the components of the passivation layer 7 formed is the same as those of the passivation layer formed in the second step.

The thickness of the passivation layer 7 formed in the fourth step is preferably 1/2 to 3/2 times the thickness of the passivation layer formed in the second step. In the present embodiment, the amount of the $C_4F_8$ supplied per hour for forming the passivation layer 7 in the fourth step is equal to the amount of the $C_4F_8$ supplied per hour for forming the passivation layer in the second step. Therefore, by adjusting the time period for supplying the $C_4F_8$, the amount of the $C_4F_8$ to be supplied can be adjusted, and in the fourth step, the formation of the passivation layer 7 is performed in a time period which is (1/2)n to (3/2)n times the time period for forming the passivation layer in the second step at one time.

In the present embodiment, in the fourth step, by supplying the $C_4F_8$ in an amount which is (1/2)n times to (3/2)n times the amount to be supplied in forming the passivation layer in the second step at one time, the passivation layer 7 is formed.

In forming the passivation layer 7 inside the trench 20 in the fourth step, the passivation layer 7 is formed over the entire back face of the printing element substrate 1.

Figure 2C:
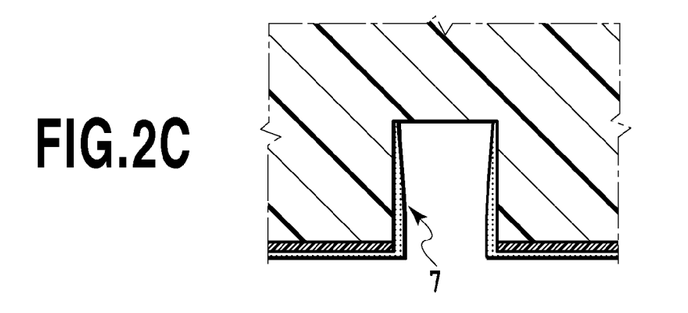

Subsequently, between n cycles of the first through third steps repeated and n cycles of the first through third steps repeated, the step of removing a passivation layer 7a formed on the bottom portion of the trench 20 is performed (a fifth step) (FIG. 2C). At this time, while the passivation layer 7a on the bottom portion of the trench 20 is removed, the passivation layer 7b formed on the back face of the printing element substrate 1 is removed. As a result, a passivation layer 7c formed on the side wall remains on the printing element substrate 1.

Figure 2D:
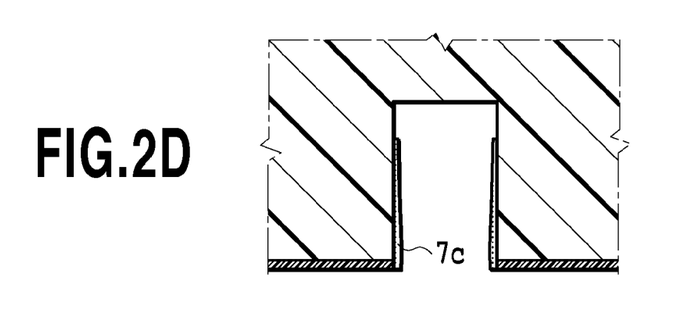

After the first through third steps are repeated in n cycles, the passivation layer 7 is formed on the side wall by an amount corresponding to the next first through third steps, and the passivation layer 7a on the bottom portion is removed, the first through third steps are further repeated in n cycles from that point. The first through third steps are repeated, and between the cycles of these steps, the step of forming the passivation layer 7 on the side wall (the fourth step) and the step of removing the passivation layer 7a on the bottom portion (the fifth step) are performed. N cycles of the first through third steps are repeated again with the fourth and fifth steps interposed between n cycles of the first through third steps and n cycles of the first through third steps. By performing, a plurality of times, n cycles of the first through third steps repeated, etching of the printing element substrate 1 is performed until the trench 20 having a desired depth is formed (FIG. 2D).

Figure 3A:
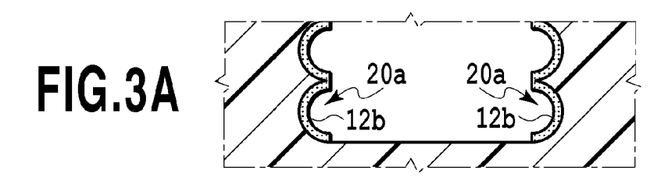
FIGS. 3A to 3F are cross-sectional views showing a periphery of a bottom portion of the trench in each of the steps, in a case where after the $n^{th}$ cycle from the first through third steps, fourth and fifth steps are performed.
Figure 3B:
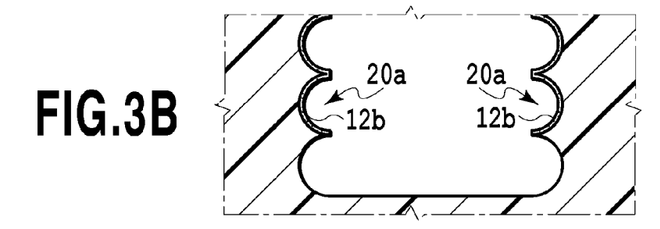
Figure 3C:
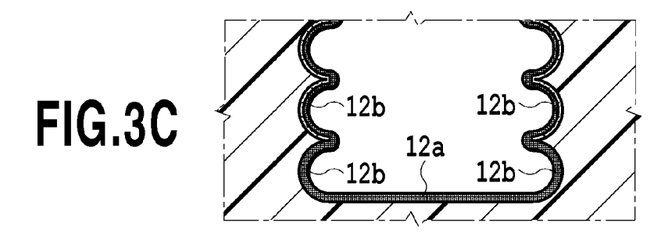
Figure 3D:
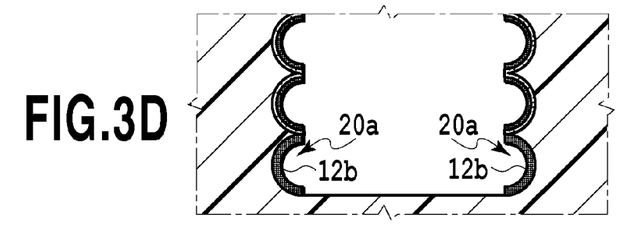

FIGS. 3A to 3F are cross-sectional views showing the periphery of the bottom portion of the trench in the fourth and fifth steps which are performed between n cycles of the first through third steps repeated and n cycles of the first through third steps repeated. As shown in FIG. 3A, once the passivation layer 12a on the bottom portion of the trench is removed in the $(n-1)^{th}$ cycle from the first through third steps, the next $n^{th}$ cycle from the first through third steps is performed. As shown in FIG. 3B, a new trench in the $n^{th}$ cycle is formed below the trench already formed. Once the new trench is formed, as shown in FIG. 3C, the passivation layer 12 is formed inside the trench. Once the passivation layer 12 is formed inside the new trench, as shown in FIG. 3D, the passivation layer 12a on the bottom portion inside the new trench is removed. Once the passivation layer 12a on the bottom portion inside the new trench is removed, the $n^{th}$ cycle from the first through third steps is completed.

Figure 3E:
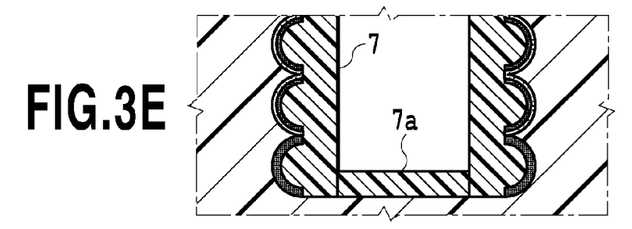

Once the first through third steps are repeated in n cycles, as shown in FIG. 3E, the fourth step is subsequently performed. In the fourth step, the passivation layer 7 having a thickness according to the number of cycles n in which the next cycle from the first through third steps is repeated is formed.

Figure 3F:
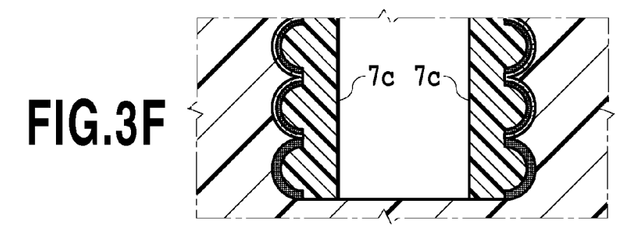

Once in the fourth step, the passivation layer 7 is formed according to the number of cycles n in which the next cycle from the first through third steps is repeated, as shown in FIG. 3F, the passivation layer 7a on the bottom portion of the trench 20 is removed, and whereby the passivation layer 7c formed on the side wall remains inside the trench.

In this manner, in a case where the first through third steps repeated in n cycles are performed a plurality of times, the passivation layer 7 is formed on the side wall in preparation for damages expected in the next n cycles of the first through third steps. Since the passivation layer 7 is formed on the side wall according to the damages in the next n cycles of the first through third steps, in the next n cycles of the first through third steps, deformation of the trench 20 due to the damages caused by ions can be surely suppressed. Further, the passivation layer 7 is formed inside the trench 20, only by an amount required in the next n cycles of the first through third steps. Accordingly, it is possible to suppress formation of an unnecessarily large passivation layer due to the formation of a large passivation layer in excess of an amount required in the next n cycles of the first through third steps, and accordingly, it is possible to suppress an excessive increase in the consumption of the CF-based gas caused by the formation of the excessively large passivation layer. Since the consumption of the CF-based gas is suppressed, the cost in etching the printing element substrate can be reduced, and whereby the cost of manufacturing the liquid ejection head can be reduced. Further, since an unnecessarily long time period for forming the passivation layer can be reduced, the time period for the step of manufacturing the printing element substrate can be shortened, and accordingly, the time period required for manufacturing the liquid ejection head can be shortened.

Here, an aspect in which between n cycles of the first through third steps and n cycles of the first through third steps, the step of forming the passivation layer on the side wall (the fourth step) and the step of removing the passivation layer on the bottom portion of the trench (the fifth step) are not performed will be described, as a comparative example, with reference to FIGS. 4A to 4C.

In the comparative example, in a case of performing etching for forming the trench having a high aspect ratio, in removing the passivation layer on the bottom portion of the trench, there may be a case where a wall surface of the side wall of the trench is gradually eroded by ions for removing the passivation layer on the bottom portion.

Figure 4A:
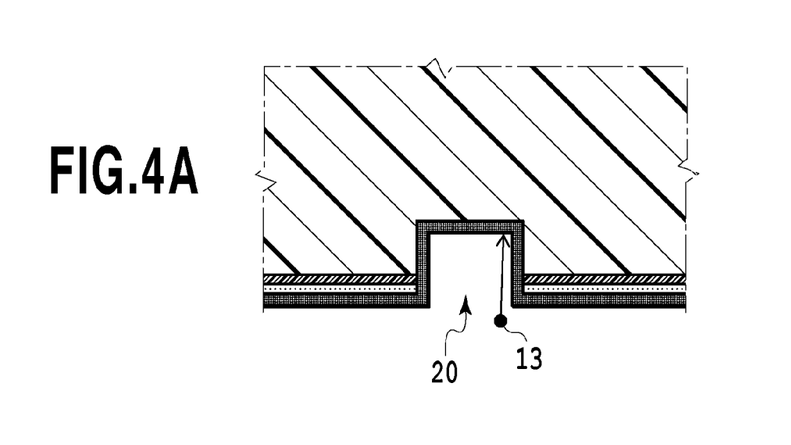
FIGS. 4A to 4C are cross-sectional views, each showing each of the steps in excavating the trench by repeating the first through third steps in forming the trench on the printing element substrate of a comparative example.
Figure 4B:
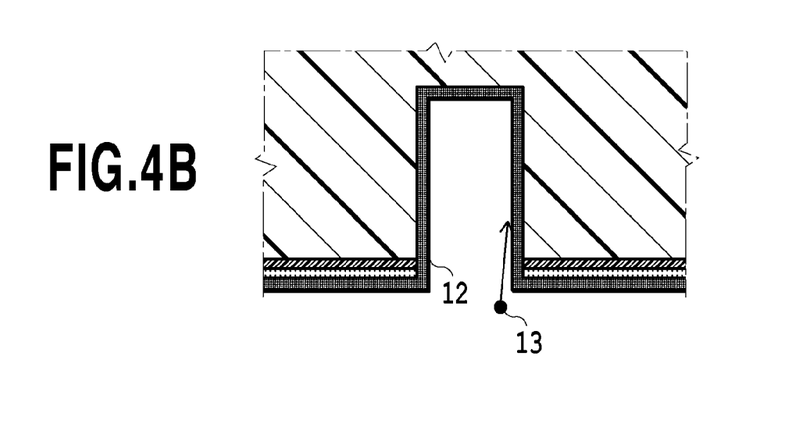
Figure 4C:
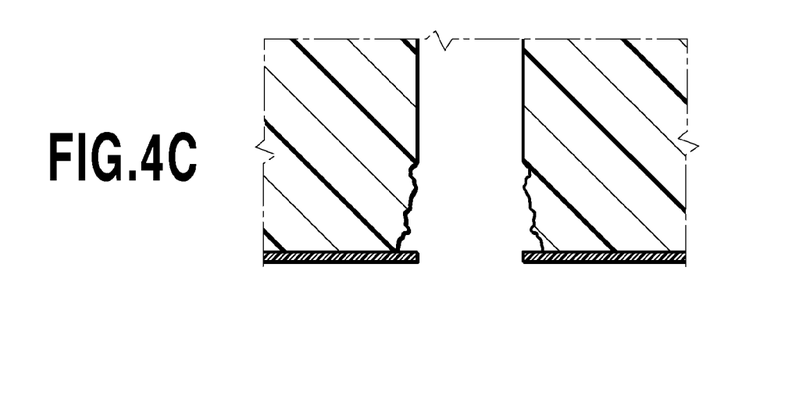

FIG. 4A shows a cross-sectional view of the trench in removing the passivation layer on the bottom portion of the trench in a state in which the trench is relatively shallow in the third step. Further, FIG. 4B shows a cross-sectional view of the trench in removing the passivation layer on the bottom portion of the trench in a state in which the trench is relatively deep in the third step. As shown in FIG. 4B, in the case of the trench having a deep shape, ions used for removing the passivation layer on the bottom portion of the trench may possibly collide with the side wall, and whereby the side wall of the trench is unintentionally etched, and as shown in FIG. 4C, a relatively shallow portion of the trench may possibly be excessively scraped off. This is because ion tracks in the third step are not ideally perpendicular to the substrate. In removing the passivation layer, the ions are biased toward the trench to be drawn into the substrate from bulk plasma, but since ions in plasma inherently have speeds in all directions, ions emitted still have a speed remaining in a surface direction (a component in a horizontal direction) of the substrate and ions colliding, less frequently, with the side wall of the trench exist.

Further, by repeating n cycles of the first through third steps, each time the passivation layer is removed in the third step, the ions having the component of the speed along the surface direction of the printing element substrate 1 repeatedly collide with the passivation layer, and whereby the number of times of collision of the ions with the passivation layer on the side wall is accumulated each time the second step is performed. Furthermore, each time the ions collide with the passivation layer on the side wall, the passivation layer is scraped off and may be deformed. Therefore, as n cycles of the first through third steps repeated are performed, the performance of the passivation layer for protecting the side wall may be possibly degraded accordingly.

Each time the formation of the passivation layer is repeated, the side wall is damaged by the collision of the ions, and accordingly, layers damaged are stacked each time the steps are repeated. Therefore, even if the time period required for forming the passivation layer in each cycle is set to be somewhat longer, the performance of the protection does not significantly improve.

Meanwhile, in the present embodiment, between n cycles of the first through third steps and n cycles of the first through third steps, the step of forming the passivation layer 7 on the side wall (the fourth step) and the step of removing the passivation layer 7 on the bottom portion of the trench (the fifth step) are performed. Therefore, it is possible to suppress, in the next n cycles of the first through third steps, excessive scraping of the side wall of the trench due to the ions generated in removing the passivation layer 12a on the bottom portion of the trench in the third step.

As standards for the aspect ratio and depth of the trench to which the present invention is applied, it is preferable that the trench formed has a depth in the range of 200 μm or greater and the aspect ratio in the range of 3 or higher. In a range in which the trench having the aspect ratio and depth below the standards is formed, prominent damages on the side wall less likely occur, and thus the passivation layer 7 to be formed in the fourth step is less required. Further, the fourth and fifth steps performed between n cycles of the first through third steps and n cycles of the first through third steps are not necessarily performed once. By repeating n cycles of the first through third steps and the fourth and fifth steps a plurality of times, a higher aspect ratio and a deeper shape are achieved. By using the configuration of the present invention, damages to the side wall inside the trench in etching the trench having a high aspect ratio can be significantly suppressed to enable the trench having a desired shape to be formed.

FIGS. 5A to 5G show cross-sectional views of the substrate in each of the steps in manufacturing the print head by means of the method for manufacturing the print head as the liquid ejection head according to the present embodiment.

Figure 5A:
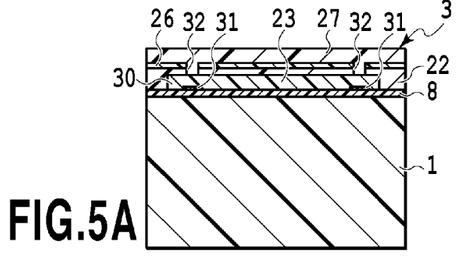
FIGS. 5A to 5G are cross-sectional views of the printing element substrate in each of the steps in forming the trench through the first through third steps repeated and the subsequent fourth and fifth steps, in a case of manufacturing a print head by forming the trench on the printing element substrate.

As shown in FIG. 5A, the printing element substrate 1 for manufacturing the print head is prepared. The printing element substrate 1 shown in FIG. 5A has an ejection port forming member 22 attached thereon, having a silicon oxide film 8 interposed therebetween. Between the printing element substrate 1 and the ejection port forming member 22, an ink path 23 and a liquid chamber 30 are formed. Both ends of the ink path 23 are provided with a printing element 31.

At a position corresponding to the printing element 31 on the ejection port forming member 22, an ejection port 32 is formed. On a surface of the ejection port forming member 22, a liquid repellent layer 26 is formed. On a side closer to the front face of the substrate, relative to the liquid repellent layer 26, on the ejection port forming member 22, a protection portion 27 is formed. In the present embodiment, as the protection portion 27, OBC (trade name) available from Tokyo Ohka Kogyo Co., Ltd. is applied over the entire surface on the side closer to the front face of the substrate, relative to the liquid repellent layer 26, on the ejection port forming member 22.

Next, on the back face of the printing element substrate 1, an etching resistant film 28 made of a polyetheramide resin (HIMAL (trade name) available from Hitachi Chemical Co., Ltd.) is formed.

Figure 5B:
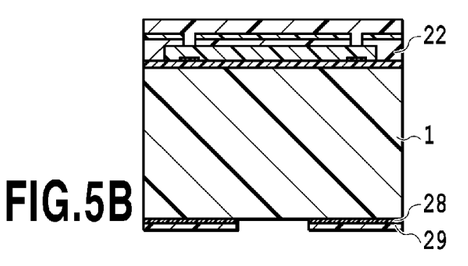

Further, over the entire back face of the etching resistant film 28, a photosensitive positive resist 29 (iP5700 (trade name) available from Tokyo Ohka Kogyo Co., Ltd.) is applied. On the positive resist applied, exposure and development are performed, through a mask formed so as to match a pattern of the supply port, by using a projection exposure apparatus, UX-4258 (trade name) manufactured by Ushio, Inc. Then, by using a mixed gas of $CF_4$ and $O_2$, a portion which is not exposed through the mask on the etching resistant film 28 is removed by chemical dry etching. In this manner, the pattern of the supply port is formed by removing the etching resistant film 28 so as to match the pattern of the supply port in a slit form. As a result, an etching mask is formed (FIG. 5B). The dimension of an opening of the mask this time is 100 μm.

Next, as an apparatus for performing etching of silicon, by using Pegasus (trade name) manufactured by Sumitomo Precision Products Co., Ltd., etching of the printing element substrate 1 is performed by employing the Bosch process to form the trench 20 on the printing element substrate 1.

Figure 5C:
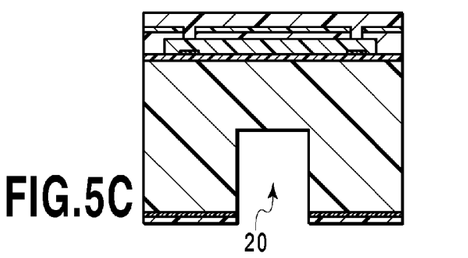

In the present embodiment, regarding the etching, an etching rate is calculated to set the number of cycles of the first through third steps repeated at one time to be 100 so that a pattern 6 to be formed has a depth of 400 μm. This corresponds to an aspect ratio of 4 (FIG. 5C).

Figure 5D:
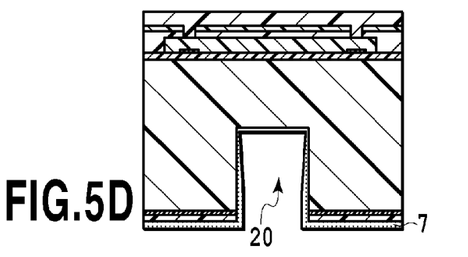

Then, as the fourth step, with the printing element substrate 1 kept in a treatment chamber, deposition of the passivation layer 7 is performed in the same deposition time period as that for performing the second step 100 times in forming the trench (FIG. 5D). At this time, the time period for the passivation step in the second step is 3.5 seconds, and therefore, treating time in the fourth step is 350 seconds.

Figure 5E:
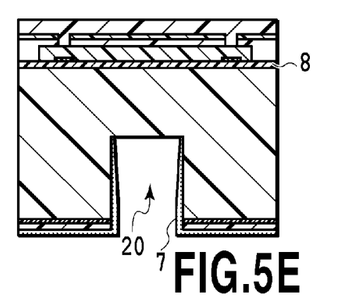

Next, as the fifth step, by using $O_2$ gas, the bottom portion of the thick passivation layer 7 which is deposited on an inner wall of the trench 20 is removed (FIG. 5E). The removal, in the third step, of the passivation layer on the bottom portion of the trench proceeds to the next first step with including over-etching, normally, and thus for both steps, the $SF_6$ can be commonly used. However, in the fifth step, since the bottom portion of the thick passivation layer 7 is removed, the time period for the over-etching becomes longer accordingly. Thus, by using $SF_6$, the silicon may possibly be substantially etched after the removal of the passivation layer 7. Therefore, the etching of the passivation layer 7 is available, but here it is preferable to use $O_2$ by which the silicon is not etched. Accordingly, in the present embodiment, the removal of the passivation layer 7 is performed by applying, to the passivation layer 7, gas including oxygen.

Then, by employing the Bosch process, the etching of the same substrate is performed again for the next etching.

It should be noted that the aspect in the present embodiment in which the first through third steps are repeated in n cycles also in the second time of the first through third steps has been explained. However, the present invention is not limited to this. The number of cycles of the first through third steps repeated at the first time is not necessarily the same as the number of cycles of the first through third steps repeated at the second time. According to the thickness and material of the printing element substrate and the etching rate, the number of cycles of the first through third steps repeated may be appropriately adjusted.

Figure 5F:
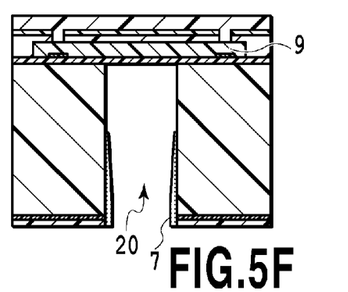

In the subsequent first through third steps repeated, the etching is performed by repeating the first through third steps until the trench reaches the silicon oxide film 8 which is an etching stop layer. The etching is stopped where the trench reaches the silicon oxide film 8 (FIG. 5F).

Figure 5G:
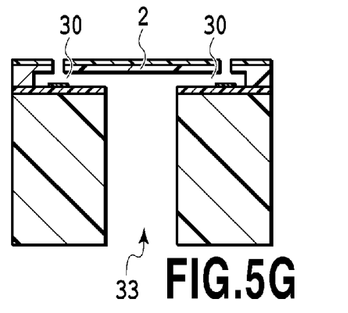

Next, by etching, a portion, of the silicon oxide film 8, which is caused to be exposed due to the trench 20 is removed. Further, at the same time, the passivation layer 7 formed along the side wall is removed (FIG. 5G). In this manner, the trench 20 extending from the back face of the printing element substrate 1 to the silicon oxide film 8 is formed. The passivation layer 7 which is deposited on the side wall of the trench 20 is immersed in EKC265 (trade name) available from E. I. du Pont de Nemours and Company to be removed. The silicon oxide film 8 which is the etching stop layer undergoes wet etching by using Buffered Hydrofluoric Acid 110U (trade name) available from Daikin Industries, Ltd. to be removed. OBC (trade name) which is the protection portion 27 is removed by using xylene, and thereafter, by exposing the entire surface from above the liquid repellant layer 26 by using Deep-UV exposure apparatus UX-3000 (trade name) manufactured by Ushio Inc., a path mold structure 9 forming a liquid path pattern is solubilized. Then, by immersing the substrate in methyl lactate while applying ultrasonic waves to the substrate, the path mold structure 9 which subsequently serves as the liquid chamber and ink path is removed (FIG. 5G). In this manner, the print head is manufactured.

As stated above, on the printing element substrate 1, the trench 20 extending from the back face of the printing element substrate 1 to the ink path 23 and liquid chamber 30 is formed, and accordingly, the ink supply port 33 is formed on the printing element substrate 1. In this manner, in the present embodiment, the trench 20 is formed so as to communicate, to the liquid chamber 30, from the back face of the printing element substrate 1 opposite to a side on which the liquid chamber 30 is defined.

Figure 6:
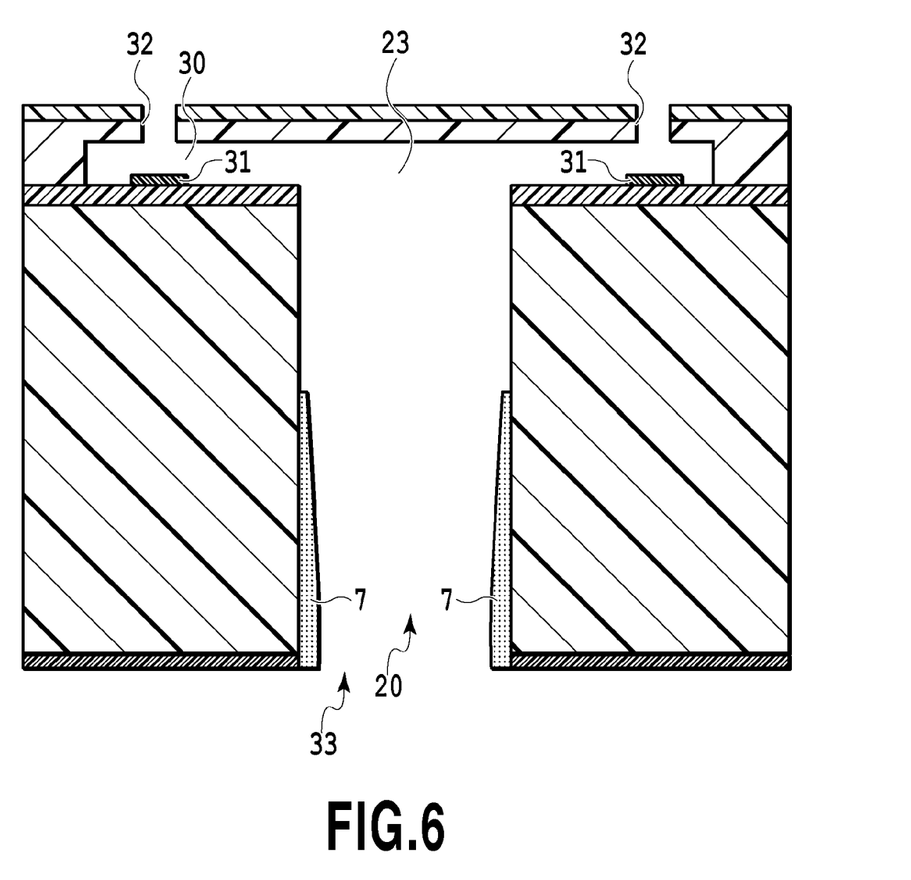
FIG. 6 is a cross-sectional view of the print head of FIG. 5G, which is manufactured in a state in which the passivation layer remains on the trench.

It should be noted that in the present embodiment, after the trench 20 is formed on the printing element substrate 1, the passivation layer 7 formed on the side wall surrounding the trench 20 is removed, but the present invention is not limited to this. It may be possible to leave the passivation layer 7 which is deposited on the side wall surrounding the trench 20 without performing the removal. In this case, as shown in, for example, FIG. 6, the passivation layer 7 may be used as a film for protecting the side wall surrounding the ink supply port against erosion by ink.

(Second Embodiment)

Next, a print head according to a second embodiment will be described. In the first embodiment, the method for manufacturing the print head has been described in which n cycles of the first through third steps repeated are performed twice and between n cycles of the first through third steps repeated and n cycles of the first through third steps repeated, the passivation layer 7 is formed. On the other hand, in the second embodiment, in order to deal with formation of a trench having a higher aspect ratio, repeating the first through third steps is performed three times. A method for manufacturing the print head will be described in which the print head is manufactured by a method in which between the first through third steps repeated and the first through third steps repeated, the fourth and fifth steps are performed, and the fourth and fifth steps are performed twice in total.

Regarding a method for preparing a sample prior to silicon etching, in proportion to the printing element substrate of the first embodiment, in the second embodiment, a printing element substrate having a thickness of 725 µm is prepared. The dimension of an opening of an etching mask is 75 µm.

Then, by using Pegasus (trade name) manufactured by Sumitomo Precision Products Co., Ltd., as an apparatus for performing the silicon etching, etching of the printing element substrate is performed by employing the Bosch process to form a trench on the printing element substrate. At this time, the first through third steps are performed n times to perform the etching of the printing element substrate.

It should be noted that for the etching, an etching rate is calculated to set the number of cycles of repeating the first through third steps to be 75 so that the depth of the trench to be formed by repeating the first through third steps in n cycles at one time is set to be 300 µm. Since the length of an opening of the trench is 75 µm, this trench corresponds to an aspect ratio of 4.

Then, as the fourth step, with the printing element substrate kept in a treatment chamber, deposition of the passivation layer 7 is performed in the same deposition time period as that for performing the second step 75 times in forming the trench. That is, by supplying the $C_4F_8$ in the same amount as that for performing the second step 75 times, the passivation layer 7 is formed. At this time, the time period for the step of forming the passivation layer in the second step is 3.5 seconds, and accordingly, treating time in the fourth step is 262.5 seconds.

Next, as the fifth step, a bottom portion of the thick passivation layer which is deposited on an inner wall of the trench is removed by using $O_2$ gas.

Further, the first through third steps are again repeated in 75 cycles to perform the etching of the substrate by employing the Bosh process. In this manner, a trench 6 is excavated on the printing element substrate. The etching this time corresponds to the first through third steps at the second time. It should be noted that also in the first through third steps at the second time, the etching rate is calculated to set the number of cycles of repeating the first through third steps to be 75 so that the depth of the trench to be excavated by the etching is 300 µm.

After repeating the first through third steps in 75 cycles, the step of forming the passivation layer (the fourth step) and the step of removing the passivation layer on the bottom portion (the fifth step) are performed.

Once the fourth step of forming the passivation layer and the fifth step of removing the passivation layer on the bottom portion are performed, 75 cycles of the first through third steps are further performed.

By repeating 75 cycles of the first through third steps twice, at this point, the trench having a depth of 600 µm is formed and the aspect ratio of the trench is 8. If the aspect ratio of the trench formed is high, it becomes difficult for the $C_4F_8$ gas for forming the passivation layer to enter the trench to the deep position of the trench. Thus, such a trench has a thinner protection layer on the side wall, and accordingly, in a case where the side wall is damaged by ions, the side wall is easily deformed. Therefore, the thick passivation layer is deposited again. Then, with the substrate kept in a treatment chamber, deposition of the passivation layer 7 is performed in the same deposition time period as that for performing the second step 75 times in excavating the trench. The time period for the passivation step is 3.5 seconds, and therefore, treating time is 262.5 seconds. Next, the bottom portion of the thick passivation layer which is deposited on the inner wall of the trench is removed by using $O_2$ gas. This corresponds to the second step at the second time.

Then, the etching of the substrate by employing the Bosch process is resumed to perform etching of a remaining portion of 125 µm before reaching a silicon oxide film 8 which is an etching stop layer on the upper portion of the trench. By performing the etching of the remaining portion of 125 µm, an ink supply port from the back face of the printing element substrate to the liquid chamber is formed. Etching of the remaining portion is also performed by repeating the first through third steps in a plurality of cycles. In this manner, the first through third steps repeated at the third time are performed. As stated above, in the present embodiment, the first through third steps repeated are performed three times and between the first through third steps and the first through third steps, the fourth and fifth steps are performed.

Subsequently, similarly to the first embodiment, the passivation layer formed along the side wall is removed. In this manner, a liquid ejection head is manufactured.

As stated above, the number of cycles of the first through third steps repeated a plurality of times is not limited to two, but may be three. Further, the number of cycles of the first through third steps repeated a plurality of times may be any number of times of four or more. The fourth step of forming the passivation layer on the side wall and the fifth step of removing the passivation layer on the bottom portion of the trench only have to be performed between the first through third steps repeated in a plurality of cycles and the first through third steps repeated in a plurality of cycles.

(Third Embodiment)

Next, a print head according to a third embodiment will be described. It should be noted that descriptions of portions which are configured in a manner similar to the above first embodiment and second embodiment are omitted by assigning the same numerals in the drawings. Only different portions will be described.

Figure 7A:
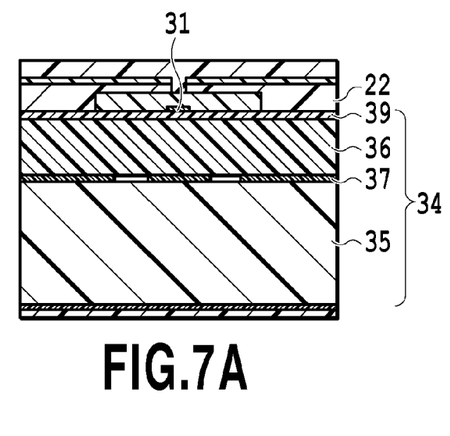
FIGS. 7A to 7F are cross-sectional views of a printing element substrate in each of steps in manufacturing a print head by forming a trench on each of a first substrate and a second substrate on the printing element substrate in a step of manufacturing the print head according to a third embodiment of the present invention.
Figure 7B:
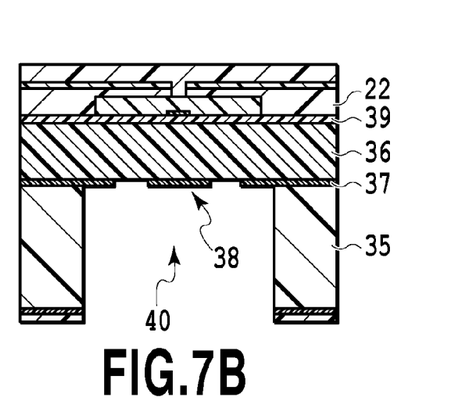
Figure 7C:
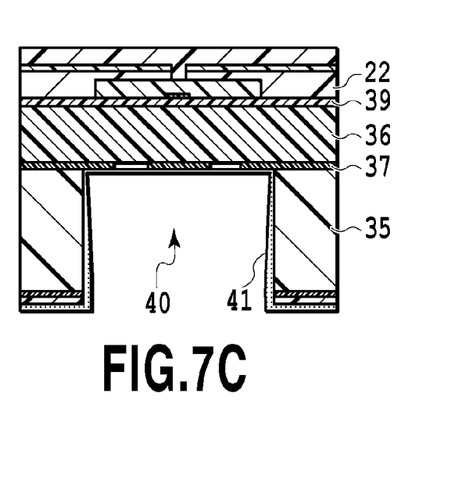
Figure 7D:
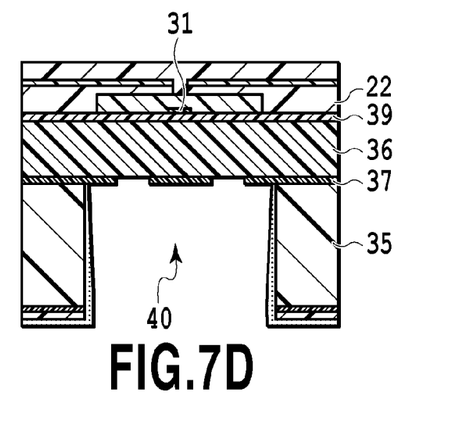

FIG. 7A is a cross-sectional view showing a printing element substrate 34 and an ejection port forming member 22 in a state prior to formation of an ink supply port on the print head according to the present embodiment. FIG. 7F shows a cross-sectional view of the print head after the ink supply port is formed on the print head according to the present embodiment.

In manufacturing the print head according to the present embodiment, the printing element substrate 34 is formed by combining a first substrate (member) 35 and a second substrate (member) 36. Between the first substrate 35 and the second substrate 36, an intermediate layer 37 is disposed.

The printing element substrate 34 on which the first substrate 35 and second substrate 36 are combined is combined with the ejection port forming member 22 and an ink supply port 43 is formed on the printing element substrate 34, and whereby the print head is formed on the printing element substrate 34 (FIG. 7F). In the present embodiment, the second substrate 36 on the printing element substrate 34 and the ejection port forming member 22 are combined.

Over the entire surface of the back face of the first substrate 35, a photosensitive positive resist (iP5700 (trade name) available from Tokyo Ohka Kogyo Co., Ltd.) is applied. The first substrate 35 and second substrate 36 are formed with silicon. In the present embodiment, the first substrate 35 is formed so as to have a thickness of 500 μm. On a surface of the first substrate 35, a thermal oxide film having 0.7 μm is formed in advance.

The intermediate layer 37 is used as a mask 38 in etching. In forming the mask 38, with respect to the positive type resist applied to a side, facing the second substrate 36, of the first substrate 35, exposure and development are performed by using a projection exposure apparatus, UX-4258 (trade name) manufactured by Ushio, Inc. The exposure and development here are performed through another mask formed according to a pattern of a trench to be formed by the etching. Thereafter, by using Buffered Hydrofluoric Acid 110U ((trade name) available from Daikin Industries, Ltd.), the mask 38 which is partially removed according to the pattern of the trench to be formed is formed, by etching partially the intermediate layer 37 formed by the thermal oxide film. The formation of the mask 38 is performed prior to combining the first substrate 35 and second substrate 36, and whereby the mask 38 to perform the etching of the second substrate 36 for forming the pattern of the supply port having a deep hole is formed on the first substrate 35. In the present embodiment, the mask 38 is formed on the first substrate 35, and the second substrate 36 is attached to the first substrate 35 in a state in which the mask 38 is formed thereon, with the mask 38 interposed therebetween.

A step of manufacturing the print head according to the present embodiment will be described. FIGS. 7A to 7F show cross-sectional views of the print head in each of the steps in manufacturing the print head according to the present embodiment. In the present embodiment, a surface of the second substrate 36 is polished such that the second substrate 36 has a thickness of 200 μm after being processed. Further, on a side, facing the ejection port forming member 22, of the second substrate 36, a silicon oxide film 39 is formed. Furthermore, on an upper surface of the silicon oxide film 39 disposed on the side, facing the ejection port forming member 22, of the second substrate 36, a printing element 31 is disposed. In this manner, after the silicon oxide film 39 and printing element 31 are disposed on the second substrate 36, the ejection port forming member 22 is combined with the second substrate 36.

Next, via the intermediate layer 37 on which the mask 38 according to the shape of the ink supply port 43 is formed, the first substrate 35 and second substrate 36 are combined (FIG. 7A). The structure of the printing element substrate 34 formed by the first substrate 35 and second substrate 36 and the ejection port forming member 22 in a stage prior to performing the etching for forming the ink supply port are the same as that of the print head according to the first embodiment and second embodiment.

Etching of the printing element substrate 34 and ejection port forming member 22, configured in a manner as stated above, is performed to form the print head.

Next, a method will be described in which by forming a relatively large trench 40 on the first substrate 35 and a relatively small trench 42 on the second substrate 36, the ink supply port is formed on the printing element substrate 34.

First, by using Pegasus (trade name) manufactured by Sumitomo Precision Products Co., Ltd., the relatively large trench 40 which will serve as the ink supply port is formed on the printing element substrate 34 by employing the Bosch process. In the Bosch process here, by repeating the first through third steps in a plurality of cycles, the etching of the first substrate 35 is performed. The etching is performed until the thermal oxide film on the intermediate layer 37 is exposed, thereby forming the relatively large trench 40 (FIG. 7B). At this time, the number of cycles of the first through third steps repeated is 125.

Next, with the printing element substrate 34 and ejection port forming member 22 kept in a treatment chamber, a passivation layer 41 is formed inside the trench 40 by performing a method similar to that of the first embodiment. At this time, by supplying the $C_4F_8$ gas in an amount corresponding to the number of cycles of the first through third steps repeated next with respect to the second substrate 36, the passivation layer is formed on the side wall of the trench 40. Here, irradiation of the $C_4F_8$ gas is performed for the same time period as that required for forming the passivation layer corresponding to 125 cycles of the first through third steps repeated in forming the trench 40, and whereby the thick passivation layer 41 is formed inside the relatively large trench 40 formed by employing the Bosch process (FIG. 7C).

Then, a bottom portion of the thick passivation layer 41 formed inside the trench 40 is removed (FIG. 7D), by using $O_2$ gas, and whereby the thick passivation layer 41 remains on the side wall of the trench 40.

Figure 7E:
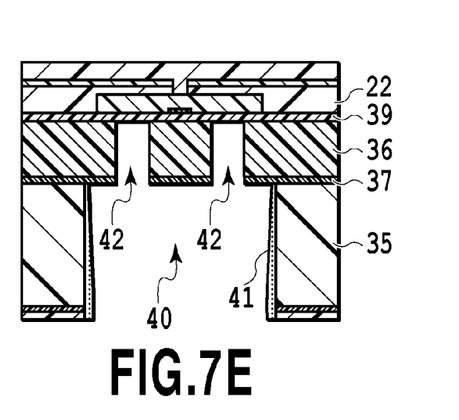
Figure 7F:
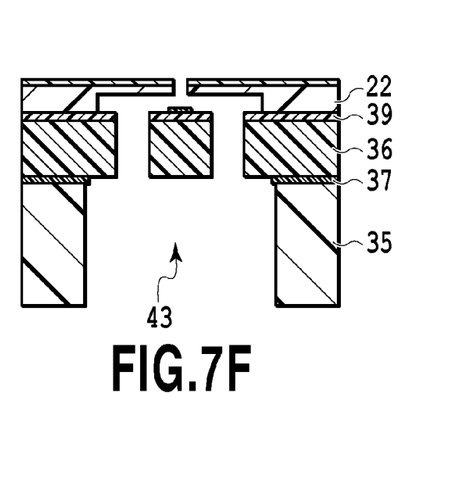

Next, similarly to forming the trench 40, by employing the Bosch process, etching of the second substrate 36 is performed until the silicon oxide film 39 which is an etching stop layer on the upper portion of the second substrate 36 is reached, and whereby the relatively small trench 42 is formed on the second substrate 36 (FIG. 7E). That is, the first through third steps are repeated in a plurality of cycles to form the trench 42 on the second substrate 36.

In order to form the relatively small trench 42 on the second substrate 36, the first through third steps are repeated. In the third step, a portion of the passivation layer to be excavated by etching in the next first step is removed. At this time, in the present embodiment, the passivation layer 41 is formed on the side wall of the relatively large trench 40, and accordingly, in forming the trench 42, deformation of the side wall of the trench 40 due to collision, to the side wall of the trench 40, of ions for removing the passivation layer formed on the bottom portion of the trench 42 can be suppressed. Since the deformation of the trench 40 is suppressed, the shape of the trench 40 formed by etching is maintained with high precision.

By forming the trench 42 on the second substrate 36, the ink supply port 43 extending from the back face of the printing element substrate 34 to an ink path and liquid chamber is formed, and whereby, ink can be supplied toward an area surrounding the printing element 31 from the back face of the printing element substrate 34. Further, according to the present embodiment, on the printing element substrate 34, the ink supply port 43 can be formed with high precision.

Thereafter, similarly to the first embodiment and second embodiment, the passivation layer 41 formed on the side wall of the trench 40 is removed (FIG. 7F). In the above manner, the print head is manufactured.

As described above, in a case where a plurality of cycles of the first through third steps are performed and a plurality of cycles of the first through third steps are again performed by having the fourth and fifth steps interposed between the plurality of cycles of the first through third steps and the plurality of cycles of the first through third steps, the widths of the trenches formed in a plurality of cycles of the first through third steps may be different from each other.

Figure 8:
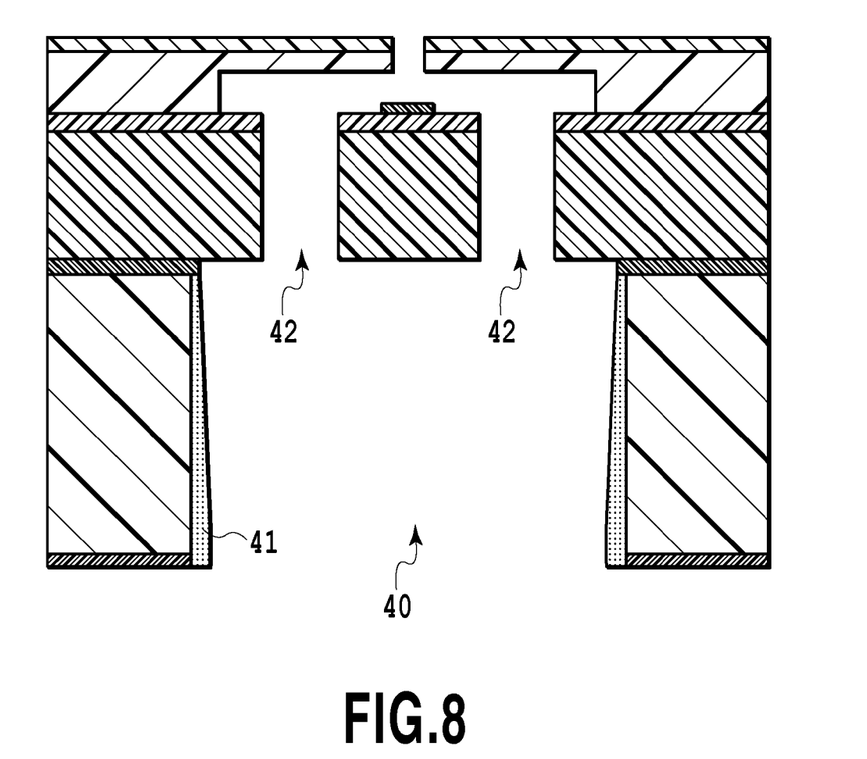
FIG. 8 is a cross-sectional view of the print head of FIG. 7F, which is manufactured with the passivation layer remaining on the trench.

It should be noted that in the present embodiment, after forming the trench 40 on the first substrate 35 and the trench 42 on the second substrate 36, the passivation layer 41 formed on the side wall of the trench 40 is removed, but the present invention is not limited to this. It is possible to leave the passivation layer 41 which is deposited on the side wall of the trench 40 without performing the removal. In this case, as shown in FIG. 8, for example, the passivation layer 41 can be used as a film for protecting the side wall of the first substrate 35 formed with silicon against erosion by ink.

It should be noted that in the above embodiment, the case has been described in which in order to form the ink supply port on the printing element substrate on the print head, the trench is formed on the printing element substrate. However, the present invention is not limited to the above embodiment, and for forming a trench as a deep groove on a substrate for other use purposes, the substrate on which the trench is formed may be a substrate other than the printing element substrate for use in the print head. A structure in which silicon is minutely processed, for example, is widely used in the MEMS field and functional devices of electric machines. In forming a trench which is a deep groove on a substrate in other fields such as the MEMS and functional devices of electric machines, the present invention may be applied.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-256176, filed Dec. 18, 2014, which is hereby incorporated by reference wherein in its entirety.

What is claimed is:

1. A processing method of a substrate comprising the steps of:
   repeating sequentially a plurality of cycles, each cycle including:
      a trench forming step of forming a trench on the substrate by etching;
      a first protection layer forming step of forming, inside the trench, a first protection layer; and
      a first protection layer removing step of removing a portion of the first protection layer covering a position at which the trench is further excavated; and
   performing a second protection layer forming step and a second protection layer removing step between a first cycle in which one cycle from the trench forming step through the first protection layer removing step is repeated a plurality of times and a second cycle which is performed subsequently to the first cycle and in which one cycle from the trench forming step through the first protection layer removing step is repeated a plurality of times, in the second protection layer forming step, a second protection layer being formed inside the trench formed in the first cycle, and in the second protection layer removing step, a portion of the second protection layer covering a position at which the trench is further excavated being removed,
   wherein a trench forming step of forming the trench on the substrate by etching is not performed between the first cycle and the second cycle.

2. The processing method of the substrate according to claim 1, wherein in a case where a number of cycles of the trench forming step through the first protection layer removing step repeated in the second cycle is n, a thickness of the second protection layer formed in the second protection layer forming step is $((1/2)n$ to $(3/2)n)$ times a thickness of the first protection layer formed in the first protection layer forming step.

3. The processing method of the substrate according to claim 1, wherein
   the substrate is formed with silicon;
   in the trench forming step, by irradiating the substrate with an F-based radical, etching is performed;
   in the first protection layer forming step, by irradiating the trench on the substrate with a CF-based gas, the protection layer is formed inside the trench; and
   in the first protection layer removing step, by irradiating the trench with $SF_6$, the first protection layer is removed.

4. The processing method of the substrate according to claim 3, wherein
   in the second protection layer forming step, by irradiating the trench on the substrate with the CF-based gas, the second protection layer is formed inside the trench; and in the second protection layer removing step, by applying gas including oxygen to the second protection layer, the second protection layer is removed.

5. The processing method of the substrate according to claim 3, wherein the trench having a depth of 200 μm or greater and an aspect ratio of 3 or higher is formed.

6. The processing method of the substrate according to claim 1, wherein the second protection layer is formed according to the number of cycles in the second cycle.

7. The processing method of the substrate according to claim 1, wherein
the first cycle ends with the first protection layer removing step;
and the second protection layer forming step is performed after the last first protection layer removing step in the first cycle without performing a trench forming step of forming a trench on the substrate by etching.

8. The processing method of substrate according to claim 1, wherein the second protection layer forming step and the second protection layer removing step are repeated between the first cycle and the second cycle.

9. The processing method of substrate according to claim 1, wherein
the second cycle starts with a trench forming step of forming a trench on the substrate by etching;
and the second protection layer removing step is performed before the initial trench forming step in the second cycle without performing a trench forming step of forming a trench on the substrate by etching.

10. A manufacturing method of a liquid ejection head including an ejection port forming member configured to form an ejection port, a substrate which is attached to the ejection port forming member, a liquid chamber being formed between the ejection port forming member and the substrate, and an element being disposed on a position facing the liquid chamber, the manufacturing method of the liquid ejection head comprising:

repeating sequentially a plurality of cycles of:
a trench forming step of forming a trench on the substrate by etching;
a first protection layer forming step of forming, inside the trench, a first protection layer; and
a first protection layer removing step of removing a portion of the first protection layer covering a position at which the trench is further excavated; and
performing a second protection layer forming step and a second protection layer removing step between a first cycle in which one cycle from the trench forming step through the first protection layer removing step is repeated a plurality of times and a second cycle which is performed subsequently to the first cycle and in which one cycle from the trench forming step through the first protection layer removing step is repeated a plurality of times, in the second protection layer forming step, a second protection layer being formed inside the trench formed in the first cycle, and in the second protection layer removing step, a portion of the second protection layer covering a position at which the trench is further excavated being removed,
wherein a trench forming step of forming the trench on the substrate by etching is not performed between the first cycle and the second cycle.

11. The manufacturing method of the liquid ejection head according to claim 10, wherein the trench is formed so as to communicate from a back face of the substrate opposite to a side on which the liquid chamber is defined to the liquid chamber.

12. The manufacturing method of the liquid ejection head according to claim 11, wherein
the substrate is formed by stacking a plurality of members;
the trench is formed on each of the plurality of members; and
the trenches formed on the plurality of members are communicated with each other.

* * * * *